US009543972B2

(12) United States Patent
Ramanan et al.

(10) Patent No.: US 9,543,972 B2
(45) Date of Patent: Jan. 10, 2017

(54) STABILITY CONTROLLED HIGH FREQUENCY CHOPPER-BASED OSCILLATOR

(71) Applicant: Texas Instruments Incorporated, Dallas, TX (US)

(72) Inventors: Ramamurthy Venkata Ramanan, Bangalore (IN); Venkiteswaran Mahadevan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/926,304

(22) Filed: Oct. 29, 2015

(65) Prior Publication Data

US 2016/0322981 A1    Nov. 3, 2016

(30) Foreign Application Priority Data

Apr. 29, 2015   (IN) .......................... 2190/CHE/2015

(51) Int. Cl.
*H03K 3/03*        (2006.01)
*H03L 7/24*        (2006.01)
*H03K 3/08*        (2006.01)
*H03L 7/00*        (2006.01)
*H03K 3/027*       (2006.01)
*H03K 3/02*        (2006.01)

(52) U.S. Cl.
CPC . *H03L 7/24* (2013.01); *H03K 3/02* (2013.01); *H03K 3/027* (2013.01); *H03K 3/0315* (2013.01); *H03K 3/08* (2013.01); *H03L 7/00* (2013.01)

(58) Field of Classification Search
CPC ............ H03K 3/08; H03K 3/02; H03K 3/027; H03K 3/0315; H03L 7/00

USPC ............... 331/144, 143, 113 R, 57, 175, 111
See application file for complete search history.

(56) References Cited

U.S. PATENT DOCUMENTS

| 2015/0061780 | A1* | 3/2015 | Bode ................... H03K 3/0231 331/25 |
| 2015/0349710 | A1* | 12/2015 | Wang ....................... H03B 5/04 331/143 |
| 2016/0056763 | A1* | 2/2016 | Zhao ........................ H03B 5/24 331/111 |

OTHER PUBLICATIONS

A CMOS, Self Calibrating, 100MHz RC-Oscillator for ASIC Applications; Timothy O'Shaughnessy; 0-7803-2707-1/95 IEEE; pp. 279-282.

(Continued)

*Primary Examiner* — Arnold Kinkead
(74) *Attorney, Agent, or Firm* — John R. Pessetto; Charles A. Brill; Frank D. Cimino

(57) ABSTRACT

Circuitry for providing an oscillating output signal. This circuitry includes a transconductance circuit having a first input, a second input, an output. The transconductance also includes a first transistor, a second transistor, and chopping circuitry. The chopping circuitry is for alternatively connecting, in a first clock cycle phase, a first node to a first terminal of the first transistor and a second node to a first terminal of the second transistor and, in a second clock cycle phase, following the first clock cycle phase, the first node to the first terminal of the second transistor and the second node to a first terminal of the first transistor. An oscillator circuit is also included and coupled to receive voltage from the output of the transconductance circuit, wherein the oscillating output signal is responsive to an output of the oscillator circuit. Further connected to the transconductance circuit are circuitry for providing a first voltage to its first input and a frequency controlled circuit for providing a second voltage to its second input.

19 Claims, 5 Drawing Sheets

(56) References Cited

OTHER PUBLICATIONS

A Two-Stage Weighted Capacitor Network for D/A-A/D Conversion; Y. S. Yee, L M. Terman, and L. G. Heller; IEEE Journal of Solid-State Circuits, vol. SC-14, No. 4, Aug. 1979; pp. 778-781.

A Temperature Compensated Digitally Trimmable On-Chip IC Oscillator With Low Voltage Inhibit Capability; A Vilas Boas and A. Olmos; 0-7803-8251-X/04 IEEE; pp. I-501-I-504.

A Precision Relaxation Oscillator with a Self-Clocked Offset-Cancellation Scheme for Implantable Biomedical SoCs; Kunil Choe, Olivier D. Bemal, David Nuttman, Minkyu Je; ISSCC 2009 / Session 23 I PLLs and Clocks / 23.7' 978-1-4244-3457-2/09 IEEE; pp. 401-404.

A 10MHz 80uW 67 ppm/°C CMOS Reference Clock Oscillator with a Temperature Compensated Feedback Loop in 0.18um CMOS; Junghyup Lee and SeongHwan Cho; 978-4-86348-010-0; 2009 Symposium on VLSI Circuits Digest of Technical Papers; pp. 226-227.

A 30-MHz, 90-ppm/°C Fully-integrated Clock Reference Generator with Frequency-locked Loop; Ken Ueno, Tetsuya Asai, and Yoshihito Amemiya; 978-1-4244-4353-6/09 IEEE; pp (unnumbered) 1-4.

An On-Chip CMOS Relaxation Oscillator With Voltage Averaging Feedback; Yusuke Tokunaga, Shiro Sakiyama, Akinori Matsumoto, and Shiro Dosho; IEEE Journal of Solid-State Circuits, vol. 45, No. 6, June 2010; 0018-9200 2010 IEEE; pp. 1150-1158.

A 32.4 ppm/°C 3.2-1.6V Self-chopped Relaxation Oscillator with Adaptive Supply Generation; Keng-Jan Hsiao; 2012 Symposium on VLSI Circuits Digest of Technical Papers; 978-1-4673-0849-6/12 2012 IEEE; pp. 14-15.

A 280nW, 100kHz, 1-Cycle Start-up Time, On-chip CMOS Relaxation Oscillator Employing a Feedforward Period Control Scheme; Takashi Tokairin, Koichi Nose, Koichi Takeda, Koichiro Noguchi, Tadashi Maeda, Kazuyoshi Kawai and Masayuki Mizuno; 2012 Symposium on VLSI Circuits Digest of Technical Papers; 978-1-4673-0849-6/12 2012 IEEE; pp. 16-17.

A 1-V, Self Adjusting, 5-Mhz CMOS RC-Oscillator; Kimmo Lasanen. Elvi Raisanen-Ruotsalainen and Juha Kosiamovaara; 0/7803-7448-7/02 2002 IEEE; pp. IV-377 to IV-380.

* cited by examiner

_US 9,543,972 B2_

STABILITY CONTROLLED HIGH FREQUENCY CHOPPER-BASED OSCILLATOR

CROSS-REFERENCES TO RELATED APPLICATIONS

This application claims priority to, the benefit of the filing date of, and hereby incorporates herein by reference, India Provisional Patent Application 2190/CHE/2015, entitled "METHOD TO TACKLE OVERLOADING ISSUES IN HIGH FREQUENCY CHOPPER-BASED OSCILLATORS" and filed Apr. 29, 2015.

STATEMENT REGARDING FEDERALLY SPONSORED RESEARCH OR DEVELOPMENT

Not Applicable.

BACKGROUND OF THE INVENTION

The preferred embodiments relate to electronic oscillators.

Electronic oscillators are well-known devices operable to produce an oscillating output signal. Thus, electronic oscillators are well-known for timing and synchronization and occur in numerous electronic circuits, devices, and industries. In many of these applications, various or all of the oscillator components are combined into an integrated circuit. As such, design considerations contemplate the oscillator as well as the overall integrated circuit. For example, with respect to the oscillator, key considerations are to reduce the effects of non-idealities in the oscillator and to ensure desired precision or lack of error in the output frequency. As another example, with respect to the integrated circuit, and of course the oscillator it includes, power consumption should be minimized, particularly in instances where the device for which the oscillator is operating has limited or consumable power (e.g., in battery-operated applications). As still another example, area consumption of the oscillator layout on the integrated circuit is desirably kept to a minimum.

Oscillators also are now being integrated, as are other complex analog circuits, into microcontrollers, as this trend reduces overall system cost by reducing the number of components. This trend is also opening up new markets and applications for microcontrollers as the capability of integrated analog grows. There are myriad numbers and varieties of end applications, and in this regard another key consideration for integrated analog circuits is to offer maximum flexibility to the end user. For example, many applications need an accurate integrated oscillator that may be linearly tuned over a wide frequency range. An example for such an application is a communication system with non-standard clock frequency.

One often important requirement for integrated oscillators is linearity of frequency tuning, as that enables a user to accurately choose and select frequency without having to measure the oscillator output frequency in every single chip. One prior publication in this context describes an oscillator with an 8 bit resistor option to trim the resistor so as to adjust oscillator frequency (Kunil Choe, Olivier D. Bernal, David Nuttman and Minkyu Je, "A Precision Relaxation Oscillator with a Self-Clocked Offset-Cancellation Scheme for Implantable Biomedical SoCs" in IEEE Intl. Solid-State Circuits Conf. Dig. Tech. Papers, February, 2009, pp. 402-403). Also in this context, another prior publication describes an oscillator with an 8 bit capacitor trim (A. V. Boas, et al., "A Temperature Compensated Digitally Trimmable On-Chip IC Oscillator with Low Voltage Inhibit Capability," Proc. ISCAS, pp. 501-504, September 2004.). In A. V. Boas, et al., with an option to use an off-chip resistor, the flexibility to directly use resistor based tune/trim schemes does not exist.

Another issue arising with oscillators is that there are components that have high mismatch with significant dependence on temperature, apart from the variations in values of resistance and capacitance affecting the frequency accuracy. To improve the Temperature Coefficient (TC) of frequency drifts and close-in phase noise, chopping has been proposed for low frequency applications. Prior publications, for example, describe offset cancellation techniques applied to an RC oscillator, but for low (32 kHz) and moderate frequencies (3 MHz) (see, e.g., Keng-Jan. Hsiao, "A 32.4 ppm/° C. 3.2-1.6V self-chopped relaxation oscillator with adaptive supply generation," Dig. Symp. VLSI Circuits, pp. 14-15, June 2012.; see also, above-introduced Kunil Choe, Olivier D. Bernal, David Nuttman and Minkyu Je, "A Precision Relaxation Oscillator with a Self-Clocked Offset-Cancellation Scheme for Implantable Biomedical SoCs" in IEEE Intl. Solid-State Circuits Conf. Dig. Tech. Papers, February, 2009, pp. 402-403.)

Given the preceding, the present inventors have identified improvements to the prior art, as are further detailed below.

BRIEF SUMMARY OF THE INVENTION

In a preferred embodiment, there is circuitry for providing an oscillating output signal. This circuitry includes a transconductance circuit having a first input, a second input, an output. The transconductance also includes a first transistor, a second transistor; and chopping circuitry. The chopping circuitry is for alternatively connecting, in a first clock cycle phase, a first node to a first terminal of the first transistor and a second node to a first terminal of the second transistor and, in a second clock cycle phase following the first clock cycle phase, the first node to the first terminal of the second transistor and the second node to a first terminal of the first transistor. An oscillator circuit is also included and coupled to receive voltage from the output of the transconductance circuit, wherein the oscillating output signal is responsive to an output of the oscillator circuit. Further connected to the transconductance circuit are circuitry for providing a first voltage to its first input and a frequency controlled circuit for providing a second voltage to its second input.

Numerous other inventive aspects and preferred embodiments are also disclosed and claimed.

DETAILED DESCRIPTION OF EMBODIMENTS

Figure 1:
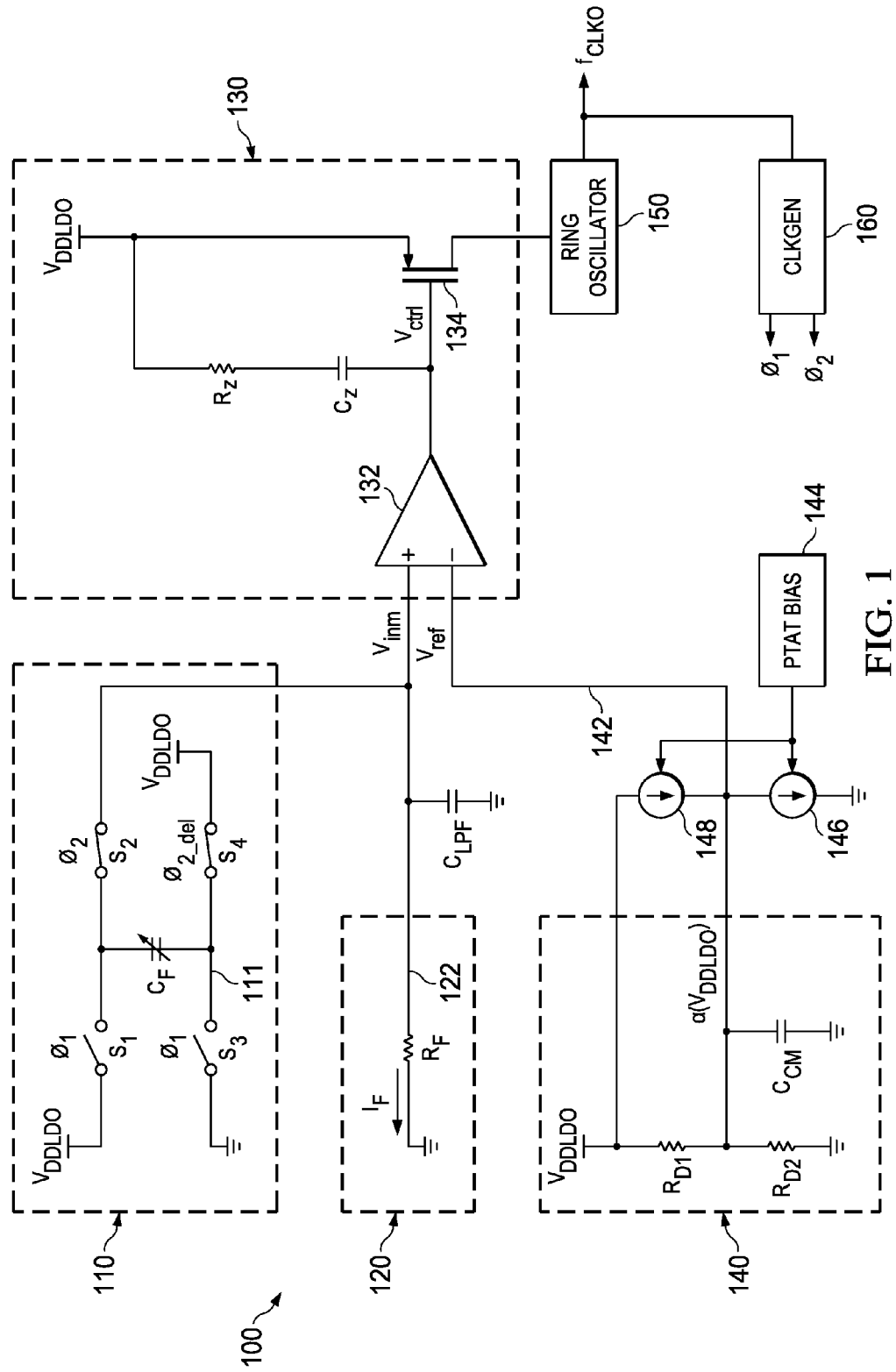
FIG. 1 illustrates a combined schematic and block diagram of a preferred embodiment oscillator.

FIG. 1 illustrates a combined schematic and block diagram of an oscillator 100 according to a preferred embodiment, where some shared aspects of oscillator 100 are also described in co-owned U.S. patent application Ser. No. 14/587,951, filed Dec. 31, 2014, as further improved by various aspects described in this document. Oscillator 100 includes a feedback frequency-controlled current source 110 and a resistance based current source 120, both sharing a node 122 that connects a frequency-controlled voltage $V_{inm}$ to a first input (e.g., non-inverting) of a transconductance circuit 130. Oscillator 100 also includes a voltage divider circuit 140, having a node 142 that connects a voltage $V_{ref}$ to a second input (e.g., inverting) of transconductance circuit 130. Transconductance circuit 130 has an output connected as an input to a ring oscillator 150, which may include a differential-to-single D2S circuit to convert signals to a rail-to-rail signal. The output of ring oscillator 150 provides the output clock signal, $f_{CLKO}$, for oscillator 100. The output clock signal, $f_{CLKO}$ is also fed back to a clock generator circuit CLKGEN 160, which provides two non-overlapping phase signals, $\phi_1$ and $\phi_2$, in response to the output clock signal, $f_{CLKO}$. As further explored below, $\phi_1$ and $\phi_2$ control the switching of feedback frequency-controlled current source 110.

Looking to feedback frequency-controlled current source 110 in additional detail, it includes a supply voltage $V_{DDLDO}$, which may be provided by a low dropout voltage source (e.g., regulator), which is well-known in the voltage supply art. The actual value of $V_{DDLDO}$ may be based on various considerations, where a contemporary value of 1.5 volts is representative. Supply voltage $V_{DDLDO}$ is connected to a first node of a switch $S_1$, the second node of which is connected to a first node of a switch $S_2$. The second node of switch $S_1$ and first node of switch $S_2$ are connected through a capacitor $C_F$ to a node 111, which is connected through a switch $S_3$ to ground and through a switch $S_4$ to $V_{DDLDO}$. Capacitor $C_F$ is shown as variable because, as detailed below, in a preferred embodiment, capacitor $C_F$ may be implemented as a selectable capacitance, such as by a segmented capacitor array. Switch $S_1$ (and switch $S_3$) opens and closes in response to phase signal $\phi_1$ of CLKGEN 160, and switch $S_2$ opens and closes in response to phase signal $\phi_2$ of CLKGEN 160 (and switch $S_4$ opens and closes in response to a signal $\phi_{2\_del}$, which as detailed later is delayed in its start after the start of $\phi_2$). More particularly, since $\phi_1$ and $\phi_2$ are non-overlapping, then when switch $S_1$ is closed, switch $S_2$ is open, thereby providing charge to capacitor $C_F$, and when switch $S_1$ is open, switch $S_2$ is closed, thereby moving charge from capacitor $C_F$ to node 122—in these operations, therefore, a current $I_F$ is supplied by the switched capacitor configuration. This current, $I_F$, is compared with resistance based current source 120 and, more particularly, this current passes $I_F$ through a resistor $R_F$ connected between ground and the first input (e.g., non-inverting) of transconductance circuit 130. In a preferred embodiment, resistor $R_F$ may be implemented as either an on-chip (i.e., integrated) or off-chip (i.e., discrete) resistor, or alternatively both may be implemented with each switchable so that in an on-chip mode the on-chip resistor is selected or in the off-chip mode the off-chip resistor is selected, based on various considerations. The selection of one resistor over the other may depend on temperature considerations, as implementing resistor $R_F$ as an off-circuit discrete element reduces or removes the temperature-dependence its resistance would have if it also were integrated with the circuit elements of oscillator 100; indeed, on-chip resistor temperature-dependence may be somewhat unpredictable. In any event, current $I_F$ passing through resistor $R_F$ creates the frequency-controlled voltage $V_{inm}$. A capacitor $C_{LPF}$ is also connected between node 122 and ground. In a preferred embodiment, the capacitance of capacitor $C_{LPF}$ is selected so as to provide a low pass filter, or stated alternatively, to attenuate or connect any high frequency signals to ground. Such a capacitor is also sometimes referred to as a decoupling capacitor and, as detailed later, also reduces ripple effects arising from feedback frequency-controlled current source 110.

Looking to voltage divider circuit 140 in more detail, it includes a resistor voltage divider with a first dividing resistor $R_{D1}$ connected between $V_{DDLDO}$ and node 142 and a second dividing resistor $R_{D2}$ connected between ground and node 142. Node 142 provides the output voltage $V_{ref}$ of voltage divider circuit 140 which, as discussed above, is connected to a second input (e.g., inverting) of transconductance circuit 130. A capacitor $C_{CM}$ is connected between node 142 and ground. Like capacitor $C_{LPF}$ described above, capacitor $C_{CM}$ is selected so as to provide a low pass filter, that is, to decouple high frequency signals to ground.

Also in oscillator 100, in one preferred embodiment, a PTAT bias block 144 and current controls 146 and 148 may be used to adjust temperature coefficient and effects of capacitor $C_F$, because in a preferred embodiment, this device (and for resistor $R_F$ when it is selected on-chip) is integrated with other circuit elements of oscillator 100. Due to this integration, the temperature dependence of such devices are more predictable and, therefore, PTAT bias block 144 and current controls 146 and 148 are included, so as to compensate either upward by sourcing current from control 148, or downward by sinking current from control 146, to counterbalance temperature dependence and thereby achieve improved oscillator performance.

Transconductance circuit 130 is extensively detailed later, so by way of introduction at this point note it is constructed for converting a differential input voltage to a current. By way of example, therefore, the schematic includes an operational amplifier 132 with the above-mentioned non-inverting and inverting inputs, and as detailed later a preferred embodiment includes chopping structure and operation in operational amplifier 132 so as to support an RC oscillator supporting a wide frequency range (e.g., 11-53 MHz) having low drift with temperature variations. The analog output of operational amplifier 132 is connected to provide a control voltage $V_{ctrl}$ to the gate of a p-channel transistor 134. The source of p-channel transistor 134 is connected to $V_{DDLDO}$, and the drain of p-channel transistor 134 provides the output of circuit 130, which as mentioned above is connected to ring oscillator 150. Circuit 130 also preferably includes a series connection of a resistor $R_Z$ and a capacitor $C_Z$ connected between $V_{DDLDO}$ and the gate of p-channel transistor 134. In a preferred embodiment, resistor $R_Z$ and a capacitor $C_Z$ create a zero into oscillator 100, in addition to dominant poles created by $R_F$ and $C_F$, and another dominant pole at the amplifier output pole due to $C_z$. There are non-dominant poles created by resistor $R_Z$ and various capacitances including parasitics, and as detailed later resistor $R_Z$ also is chosen with consideration to reducing ripple. As a result, therefore, oscillator 100 has a second order feedback so as to suppress potential DC errors.

Ring oscillator 150 may be constructed using various configurations as known in the art. In general, ring oscillator 150 includes an odd number of cascaded inverters, with the last inverter in the cascade having an output for providing an oscillating signal that is fed back to the first inverter in the cascade, and the output is typically also connected to a buffer, which thereby provides the ultimate ring oscillator output. In this regard, therefore, an input signal state to the cascade will propagate through the odd number of inverters to appear at the cascade output in a state complementary to the state that was input to the first inverter in the cascade. With this feedback (i.e., the completion of the "ring"), such an oscillator will continue to toggle its output state back and forth, so long as the oscillator is provided a sufficient biasing power (i.e., voltage/current) from transconductance circuit 130.

CLKGEN 160 may be constructed using various configurations as known in the art, using circuitry to provide the two non-overlapping phase signals, $\varnothing_1$ and $\varnothing_2$, from the single phase of the output clock signal, $f_{CLKO}$. For reasons detailed below, CLKGEN 160 in a preferred embodiment also provides a delayed version of $\varnothing_2$, hereafter indicated as $\varnothing_{2\_del}$, which starts after a small delay following the start of $\varnothing_2$ and which ends when $\varnothing_2$ ends. As also discussed below, the delay between $\varnothing_2$ and $\varnothing_{2\_del}$ is sufficient in duration to minimize a charge disturbance that otherwise could occur based on the changing of states of switches $S_1$ and $S_2$ as well as the movement of charge with respect to the capacitors that form capacitor $C_F$, as further described below with respect to FIG. 2.

The operation of oscillator 100 is now described in general, followed by a more detailed analysis of various circuit attributes to enhance an understanding of novel aspects as well as favorable performance. Starting in general, at power-up, $f_{CLKO}$ initially is not operable so the switches $S_1$ and $S_2$ in feedback frequency-controlled current source 110 do not alternate open/closed, current $I_F$ is not created through resistance based current source 120, and the voltage $V_{inm}$ across resistor $R_F$ is low or zero. Voltage divider circuit 140, however, divides $V_{DDLDO}$ according to a ratio α (based on the relative resistance of $R_{D1}$ and $R_{D2}$), so that $V_{ref}$ is an amount of voltage of α times $V_{DDLDO}$. Thus, initially the inverting input of operational amplifier 132 is greater than its non-inverting input, thereby driving the output operational amplifier 132 low, which is applied to the gate of p-channel transistor 134. P-channel transistor 134 is therefore enabled and supplies current to ring oscillator 150, which begins to oscillate and provides an output oscillating signal to produce the corresponding output clock signal, $f_{CLKO}$, which begins to oscillate. In response to $f_{CLKO}$, CLKGEN 160 begins to provide non-overlapping phase signals, $\varnothing_1$ and $\varnothing_2$, which are fed back to frequency-controlled current source 110. In response to this feedback, frequency-controlled current source 110 begins to provide current $I_F$, so as to raise the voltage $V_{inm}$ across resistor $R_F$, and that voltage $V_{inm}$ is input to the non-inverting input of amplifier 132. In other words, the combination of frequency-controlled current source 110 and resistance based current source 120 effectively provide a frequency-controlled voltage, $V_{inm}$. Further, as is known, the closed loop feedback system will thereafter operate or stabilize toward establishing an equilibrium between the inverting and non-inverting inputs of amplifier 132, thereby adjusting the output of amplifier 132 and the current provided by transconductance circuit 130, so as to stabilize $f_{CLKO}$ at a steady-state frequency. One skilled in the art will understand that this steady-state frequency is therefore defined by the values of $C_F$, $R_F$, and α, and it is independent of $V_{DDLDO}$. Thus, one skilled in the art may select each of these three values so as to achieve a desired $f_{CLKO}$. In other words, $f_{CLKO}$ responds to the capacitance of $C_F$ and $R_F$, and the voltage divider α from the values of $R_{D1}$ and $R_{D2}$ provide an additional "trim" of $f_{CLKO}$. Moreover, below are described additional aspects that may further improve the performance of oscillator 100, such as its insensitivity to temperature changes and various potential non-idealities.

Figure 2:
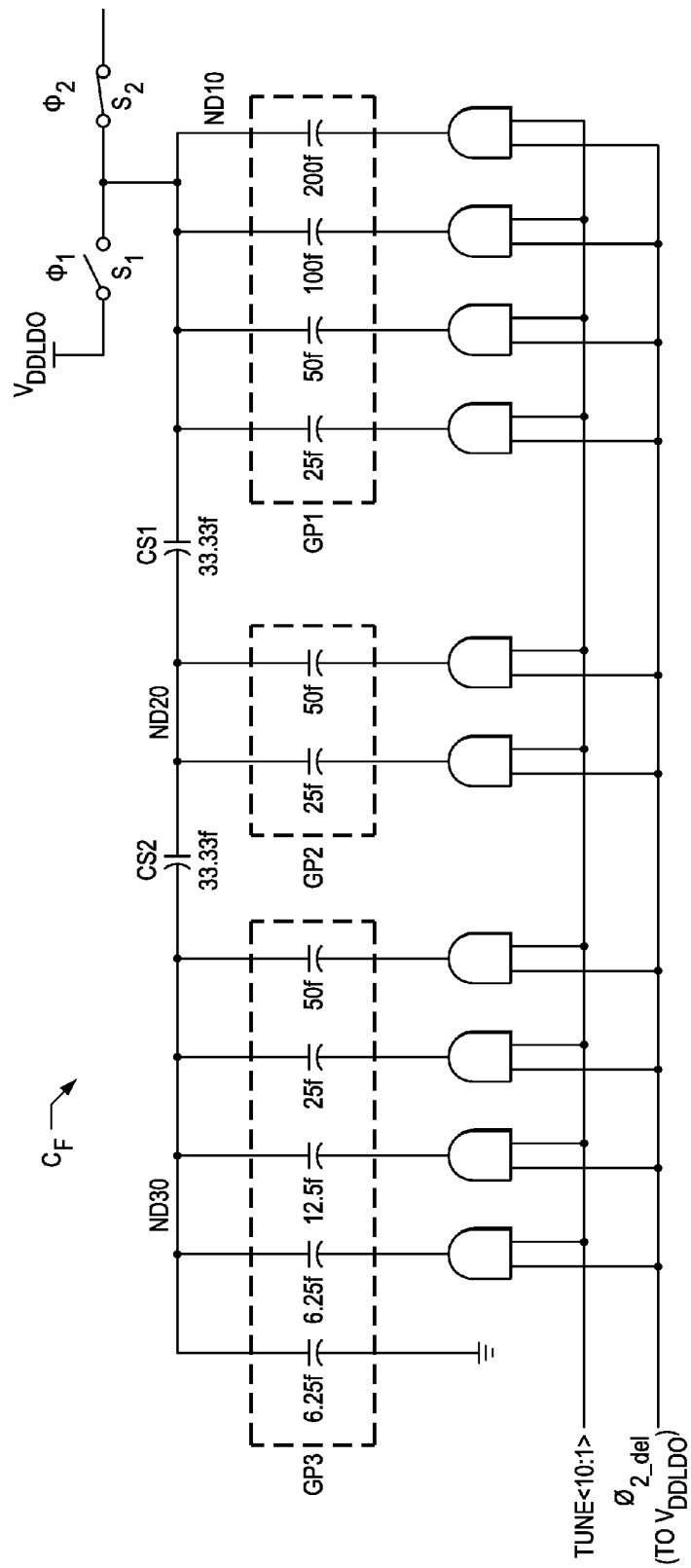
FIG. 2 illustrates a schematic of a preferred embodiment capacitor array circuit for use as the variable capacitor $C_F$ shown in FIG. 1.

FIG. 2 illustrates a schematic of a preferred embodiment capacitor array circuit for use as the variable capacitor $C_F$ shown in feedback frequency-controlled current source 110 of FIG. 1. The array includes a 4-2-5 segmentation of capacitors, that is, a first group GP1 of 4 capacitors, a second group GP2 of 2 capacitors, and a third group GP3 of 5 capacitors. In group GP1, each capacitor has a first plate connected to a node ND10, and a second plate connected to the output of a respective AND gate, and each such capacitor in the group has a different value, with exemplary values of 25 fF (units in the Figure shown as "f"), 50 fF, 100 fF, and 200 fF. Group GP1 is separated from group GP2 by a 33.33 fF capacitor CS1, connected between node ND10 and a node ND20. In group GP2, each capacitor has a first plate connected to node ND20, and a second plate connected to the output of a respective AND gate, and each such capacitor in the group has a different value, with exemplary values of 25 fF and 50 fF. Group GP2 is separated from group GP3 by a 33.33 fF capacitor CS2, connected between node ND20 and a node ND30. In group GP3, each capacitor has a first plate connected to node ND30, and a second plate of four of the capacitors is connected to the output of a respective AND gate, and each such capacitor in the group has a different value, with exemplary values of 6.25 fF, 12.5 fF, 25 fF, and 50 fF. A fifth capacitor in group GP3 is connected between node ND30 and ground. Lastly, a first input to each of the 10 AND gates is connected to receive a respective bit from a 10-bit Tune code, so as to permit selection of any subset of the three groups of capacitors in a given period of the delayed signal phase $\varnothing_{2\_del}$, the latter being connected to the second input of each AND gate and thereby also providing a selectable total capacitance provided by the array for that delayed signal phase.

In operation, during signal phase $\varnothing_1$, the entire capacitance of $C_F$ is charged by $V_{DDLDO}$, thereby providing a constant load capacitance (e.g., 0.55 fF) to the LDO during that phase irrespective of the 10-bit Tune signal. Note that this significantly and favorably relaxes the LDO load regulation specification. Moreover, the capacitor area reduces by 16× compared to the case where segmentation is not used. When signal phase $\varnothing_2$ starts, the switches $S_1$ and $S_2$ take the position shown in FIG. 1, and the top plate of $C_F$ is connected to node 122 at which time capacitor $C_{LPF}$ reduces the voltage jump so as to prevent the back conduction of the switch $S_1$ to $V_{DDLDO}$. Next, recalling that $\varnothing_{2\_del}$ follows when signal phase $\varnothing_2$ starts, then during $\varnothing_{2\_del}$ the AND gates shown in FIG. 2 that also are selected by the Tune signal are enabled so as to connect $V_{DDLDO}$ to the capacitor bottom plates (which were grounded during $\varnothing_1$) shown connected to those gates during which time again capacitor $C_{LPF}$ reduces the voltage jump. As a result, the charge taken away from $V_{DDLDO}$ is a non-linear function of the Tune code. This causes the ripple at the LDO output to be non-linear, hence a potential non-linearity in frequency. To mitigate this, the preferred embodiment uses a low power and low bandwidth LDO with 100 pF output decoupling capacitor to suppress the ripple. The frequency tune linearity may be limited to less than 10 bits (e.g., 9-bit) because of this artifact, although this can be improved either by increasing decoupling capacitance at the cost of area or by using a dummy switched capacitor load to make the charge taken from $V_{DDLDO}$ constant for all Tune codes.

Given the preceding, the configuration of FIG. 2 implements nine bit tuning, using a segmented capacitor array. A 4-2-5 segmentation is used to reduce the total capacitance to 1.6 fF. The preferred embodiment split capacitor array offers two main advantages:

1) Load capacitance for $V_{DDLDO}$ in phase $\phi_1$ is constant (0.55 fF) for all Tune codes—this significantly relaxes the LDO load regulation specification.

2) The capacitor area reduces by 16× compared to the case where segmentation is not used.

Also in a preferred embodiment, oscillator 100 is constructed to operate in two frequency ranges. In the lower frequency range (e.g., 11 to 36 MHz), two identical capacitor arrays, such as illustrated in FIG. 2, are connected and used in parallel. In contrast, for the higher frequency range (e.g., 30 to 53 MHz) a single capacitor array such as in FIG. 2 is connected is used. Splitting the ranges in this regard helps in 1) relaxed amplifier design; 2) improving period jitter by reducing VCO sensitivity; and 3) minimizing the systematic errors from non-idealities in chopping.

The general operation of controlled current source 110, given the programmable capacitor array of FIG. 2, should be understood by one skilled in the art, but is briefly addressed here. During phase $\phi_1$, the top plate of each group capacitor in the array is charged to $V_{DDLDO}$ and the bottom plate is connected to ground. During phase $\phi_2$, the top plate is connected to node 122 ($V_{inm}$) of operational amplifier 132 and during $\phi_{2\_del}$ (delayed version of $\phi_2$) the bottom plate is switched to $V_{DDLDO}$. Capacitor array switching generates voltage ripple at $V_{inm}$ that can create non-linearity and duty cycle degradation. Filter capacitor $C_{LPF}$ is used to minimize the ripple. In all events, programmability of capacitance and hence, of the responsive frequency $f_{CLKO}$, is achieved by varying the fraction ($\beta$) of the total capacitance (C) whose bottom plate is switched to $V_{DDLDO}$ to transfer charge (current) into the $V_{inm}$. The bottom plate of the remaining $(1-\beta)*C$ capacitor(s) is grounded in both phases $\phi_1$ and $\phi_2$. The average current I that the frequency-controlled current source 110 pumps into node 122 ($V_{inm}$) is given by the following Equation 1:

$$I = C*V_{DDLDO}*f_{CLKO} - (\beta*C*(\alpha-1) + (1-\beta)*C*\alpha)*V_{DDLDO}*f_{CLKO} \quad \text{Equation 1}$$

Equating the results of Equation 1 to $\alpha(V_{DDLDO})/R_F$ provides the frequency $f_{CLKO}$, as shown in the following Equation 2:

$$f_{CLKO} = \alpha/(R_F*C(1-\alpha+\beta)) \quad \text{Equation 2}$$

Figure 3A:
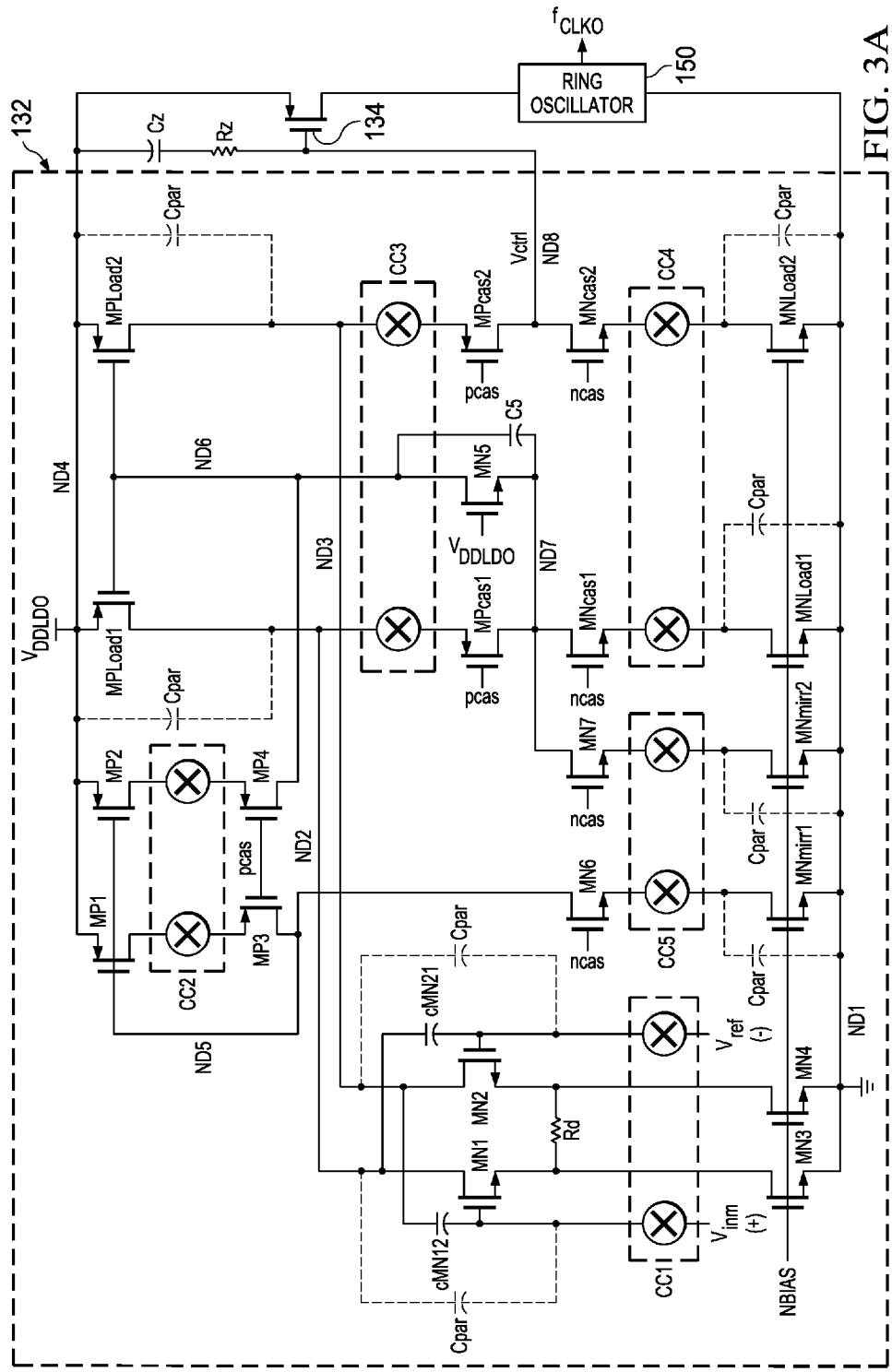
FIG. 3A illustrates a schematic of a preferred embodiment of operational amplifier 132, along with the remaining elements of transconductance circuit 130 and a block diagram indication of ring oscillator 150, all shown in FIG. 1.
Figure 3B:
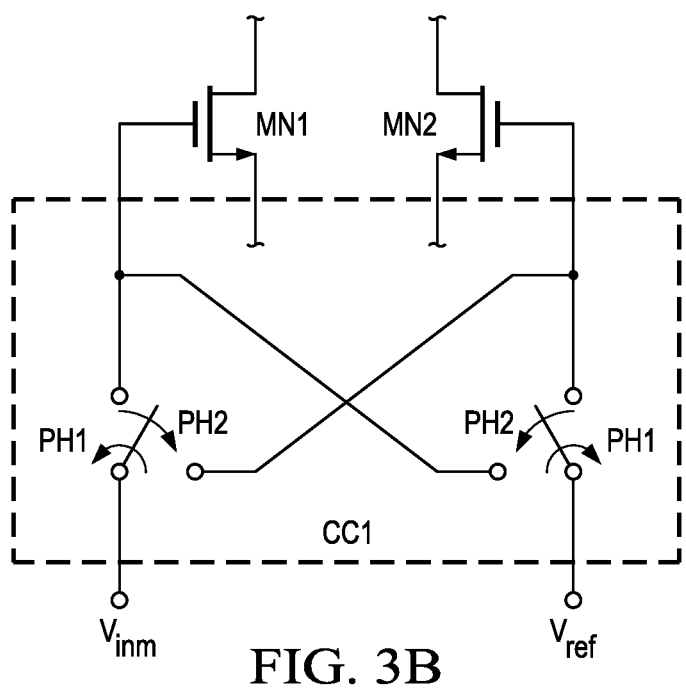
FIG. 3B illustrates a functional electrical diagram of the chopping convention used in various locations of FIG. 3A.

FIG. 3A illustrates a schematic of a preferred embodiment of operational amplifier 132, along with the remaining elements of transconductance circuit 130 and a block diagram indication of ring oscillator 150. In general, operational amplifier 132 is implemented as a folded cascode amplifier, with various elements and connections that are now explored. Starting toward the left of FIG. 3A, a gate of an n-channel transistor MN1 represents the non-inverting input (shown as (+)), and a gate of an n-channel transistor MN2 represents the inverting input (shown as (−)). In relation to the gates of n-channel transistors MN1 and MN2, a chopper connection enclosure CC1 is shown by way of a dashed enclosure, where comparable connections are elsewhere in FIG. 3A and so a first is now introduced as should be readily understood by one skilled in the art with respect to the various counterparts also illustrated. Specifically, for both the gates of n-channel transistors MN1 and MN2, each is shown connected to a respective X-hatched circle, and further a dashed enclosure includes both of those circles. By way of convention in this document, these illustrations are intended to depict that a chopper switching system is included with respect to the X-hatched circles that are paired by way of such a dashed enclosure, where chopper switching is known in the circuitry art and is further illustrated by way of example in FIG. 3B, which illustrates an electrical functional diagram of chopper connection enclosure CC1 with respect to n-channel transistors MN1 and MN2. More specifically, therefore, as oscillator 100 oscillates and presents its periodic $f_{CLKO}$ signal, the $f_{CLKO}$ signal also is used for the chopping circuitry to switch at the rate of the $f_{CLKO}$ signal. Thus, for one phase PH1 of the clock cycle of $f_{CLKO}$ (e.g., a first half period of $f_{CLKO}$), the input signals to gates of re-channel transistors MN1 and MN2 are electrically connected as shown in FIG. 3A and with each switch in FIG. 3B pivoting in the direction shown therein as PH1, and for the next successive phase PH2 (e.g., a second half period of $f_{CLKO}$), in that same clock cycle of $f_{CLKO}$, the input signals to gates of n-channel transistors MN1 and MN2 are electrically switched with respect to one another, that is, with each switch in FIG. 3B pivoting in the direction shown therein as PH2. Thus, for a first phase (e.g., PH1) of a clock cycle of $f_{CLKO}$, $V_{inm}$ is connected to the gate of n-channel transistor MN1 and $V_{ref}$ is connected to the gate of n-channel transistor MN2, but for a second successive phase (e.g., PH2) of that $f_{CLKO}$ clock cycle following the first phase of the clock cycle, then $V_{inm}$ is connected to the gate of n-channel transistor MN2 while $V_{ref}$ is connected to the gate of n-channel transistor MN1, switching alternatively across two phases for each successive $f_{CLKO}$ clock cycle. As further detailed below, chopping in this manner alleviates input offset that otherwise may arise due to a mismatch between, and temperature variation effects of, the chopped pair of transistors, which in this case are n-channel transistors MN1 and MN2.

Continuing with respect to other connections of n-channel transistors MN1 and MN2, the source of n-channel transistor MN1 is connected to the drain of an n-channel transistor MN3, which has its gate connected to receive a bias signal NBIAS and its drain connected to a node ND1, which preferably is connected to a low reference voltage (e.g., ground). The source of n-channel transistor MN2 is connected to the drain of an n-channel transistor MN4, which has its gate also connected to receive bias signal NBIAS and its drain connected to node ND1. A resistor Rd is connected between the sources of n-channel transistors MN1 and MN2. The drain of n-channel transistor MN1 is connected to a node ND2, and the drain of n-channel transistor MN2 is connected to a node ND3. In connection with a preferred embodiment, it is recognized that each of n-channel transistors MN1 and MN2 has a respective parasitic capacitance between its gate and its drain; for sake of discussion, therefore, FIG. 3A illustrates these capacitances as capacitors shown in phantom (as are other transistor source-to-drain parasitic capacitances). Moreover, cross-coupled capacitances are included with respect to n-channel transistors MN1 and MN2 so as to counteract these parasitic capacitances. Thus, a capacitor cMN12 is connected from the gate of n-channel transistor MN1 to the drain of n-channel transistor MN2, and a capacitor cMN21 is connected from the gate of n-channel transistor MN2 to the drain of n-channel transistor MN1. The capacitance value of capacitor cMN12 and capacitor cMN21 is selected to be preferably equal to the gate-to-source capacitances of the respective n-channel transistors MN1 and MN2, or note that the capacitance value of capacitor cMN12 and capacitor cMN21 may be larger than those gate-to-source capacitances so as to compensate for other errors arising from parasitic capacitance elsewhere in amplifier 132.

Operational amplifier 132 also includes a p-channel transistor MP1 and a p-channel transistor MP2, both of which have a respective source connected to a node ND4, which is connected to receive the voltage $V_{DDLDO}$. The gates of p-channel transistors MP1 and MP2 are connected to a node ND5. Each drain of p-channel transistors MP1 and MP2 is chopper connected to a respective source of a p-channel transistor MP3 and MP4, as shown by chopper connection enclosure CC2. Thus, for a first phase of a clock cycle of $f_{CLKO}$, the drain of p-channel transistor MP1 is connected to the drain of p-channel transistor MP3 and the drain of p-channel transistor MP2 is connected to the drain of p-channel transistor MP4, while for a second successive phase following the first phase of that clock cycle, then the drain of p-channel transistor MP1 is connected to the drain of p-channel transistor MP4 and the drain of p-channel transistor MP2 is connected to the drain of p-channel transistor MP3, switching alternatively in this manner for each phase pair in each successive clock cycle. Also with respect to p-channel transistors MP3 and MP4, the gate of each device is connected to receive a p-channel transistor bias signal pcas. Further, the drain of p-channel transistor MP3 is connected to node ND5, and the drain of p-channel transistor MP4 is connected to a node ND6.

Operational amplifier 132 also includes a p-channel transistor MPLoad1 and a p-channel transistor MPLoad2, both of which have a source connected to node ND4 and a gate connected to node ND6. The drain of p-channel transistor MPLoad1 is connected to node ND2, and the drain of p-channel transistor MPLoad2 is connected to node ND3. Each of p-channel transistor MPLoad1 and p-channel transistor MPLoad2 has a respective parasitic source-to-drain capacitance, again shown in phantom.

Node ND2 is chopper connected to a source of a p-channel transistor MPcas1, and node ND3 is chopper connected to a source of a p-channel transistor MPcas2, as shown by a chopper connection enclosure CC3. Thus, for a first phase of a clock cycle of $f_{CLKO}$, node ND2 is connected to the source of p-channel transistor MPcas1 and node ND3 is connected to the source of p-channel transistor MPcas2, while for a second phase in that same clock cycle following the first phase in that clock cycle, then node ND2 is connected to the source of p-channel transistor MPcas2 and node ND3 is connected to the source of p-channel transistor MPcas1, switching alternatively in this manner for each phase pair in each successive clock cycle. Further in this regard, note also that CC1 and CC3 are preferably switched together, that is, when CC1 is switched to the position shown in FIG. 3A (i.e., with $V_{inm}$ to the gate of n-channel transistor MN1 and $V_{ref}$ to the gate of n-channel transistor MN2), then CC3 is also switched to the position shown in FIG. 3A (i.e., with node ND2 connected to the source of p-channel transistor MPcas1 and node ND3 to the source of p-channel transistor MPcas2), and vice versa with respect to the alternative switching positions of CC1 and CC3 described earlier.

The drain of p-channel transistor MPcas1 is connected to a node ND7, and the drain of p-channel transistor MPcas2 is connected to a node ND8. An n-channel transistor MN5 has its drain connected to node ND6, its source connected to node ND7, its gate to $V_{DDLDO}$, and a capacitor C5 between its drain and source.

Node ND7 is also connected to a drain of an n-channel transistor MNcas1, and node ND8 is also connected to a drain of an n-channel transistor MNcas2. The gates of n-channel transistors MNcas1 and MNcas2 both are connected to receive an n-channel transistor bias ncas. The source of n-channel transistor MNcas1 is chopper connected to a drain of an n-channel transistor MNLoad1, and the source of n-channel transistor MNcas2 is chopper connected to a drain of an n-channel transistor MNLoad2, as shown by a chopper connection enclosure CC4. Thus, for a first phase of a clock cycle of $f_{CLKO}$, the source of n-channel transistor MNcas1 is connected to a drain of n-channel transistor MNLoad1 and the source of n-channel transistor MNcas2 is connected to a drain of n-channel transistor MNLoad2, while for a second successive phase of that clock cycle following the first phase, then the source of n-channel transistor MNcas1 is connected to a drain of n-channel transistor MNLoad2 and the source of n-channel transistor MNcas2 is connected to a drain of n-channel transistor MNLoad1, switching alternatively in this manner for each phase pair in each successive clock cycle. The gates of n-channel transistors MNLoad1 and MNLoad2 are connected to receive NBIAS, and the sources of n-channel transistors MNLoad1 and MNLoad2 are connected to node ND1.

Operational amplifier 132 also includes a current mirroring configuration that includes an n-channel transistor MNmirr1 and an n-channel transistor MNmirr2, both of which have a respective source connected to node ND1 and a gate connected to receive NBIAS. Each of n-channel transistor MNmirr1 and n-channel transistor MNmirr2 also has a respective parasitic source-to-drain capacitance, again shown in phantom. The drain of n-channel transistor MNmirr1 is chopper connected to a source of an n-channel transistor MN6, and the drain of n-channel transistor MNmirr2 is chopper connected to a source of an n-channel transistor MN7, as shown by a chopper connection enclosure CC5. Thus, for a first phase of a clock cycle of $f_{CLKO}$, the drain of n-channel transistor MNmirr1 is connected the source of re-channel transistor MN6 and the drain of n-channel transistor MNmirr2 is connected to the source of n-channel transistor MN7, while for a second successive phase in that clock cycle following the first phase, then the drain of n-channel transistor MNmirr1 is connected the source of n-channel transistor MN7 and the drain of re-channel transistor MNmirr2 is connected to the source of n-channel transistor MN6, switching alternatively in this manner for each phase pair in each successive clock cycle.

The operation of operational amplifier 132 in general should be understood given the preceding and the skill in the art—generally, initially the inverting input of operational amplifier 132 is greater than its non-inverting input, thereby causing n-channel transistor MN2 to conduct considerably more current than n-channel transistor MN1, and with the current path of n-channel transistor MN2 thereby also including p-channel transistor MPLoad2, causing Vctrl at node ND8, that is the output of operational amplifier 132, to go low which, as described earlier, causes p-channel transistor 134 to conduct current to ring oscillator 150. In more detail, p-channel transistors MPLoad1 and MPLoad2 source current to nodes ND2 and ND3, respectively. As a result, the sourced current from p-channel transistor MPLoad1 splits between the source-to-drain path of n-channel transistor MN1 and the source-to-drain path of n-channel transistor MNLoad1, while the sourced current from p-channel transistor MPLoad2 splits between the source-to-drain path of re-channel transistor MN2 and the source-to-drain path of n-channel transistor MNLoad2. The amount of split for each of these paths will depend on the differential signal between $V_{inm}$ and $V_{ref}$, thereby ultimately adjusting the signal at node ND8, that is, supplying Vctrl and thereby biasing the gate of a p-channel transistor 134, which in turn supplies current to ring oscillator 150 so as to increase $f_{CLKO}$ with the increase of supplied current. Similarly, if frequency $f_{CLKO}$ is initially too high, then $V_{inm}$ will exceed $V_{ref}$ and n-channel transistor MN1 will conduct more current than n-channel transistor MN2, in which case Vctrl will rise and reduce the current provided by p-channel transistor 134, thereby reducing $f_{CLKO}$. Thus, ultimately with the feedback described earlier in connection with FIG. 1, therefore, the inverting input of operational amplifier 132 approximates that of its non-inverting input, thereby further adjusting the output Vctrl of operational amplifier 132 so that $f_{CLKO}$ steadies to a frequency based on $R_F$ and $C_F$.

Also in connection with operational amplifier 132, note that p-channel transistors MP1 and MP2, n-channel transistors MNmir1 and MNmir2, and re-channel transistor MN5 are used to provide a level shifter loop for biasing node ND7. Particularly, n-channel transistor MN5 level shifts node ND7 by $V_{DDLDO}$ minus the gate-to-source voltage across n-channel transistor MN5, with capacitor C5 across its source to drain used for compensation of this loop. In this manner, note that n-channel transistor MN5 maintains a relatively stable voltage at node ND7, relative to the node ND8 voltage of Vctrl, thereby also maintaining a proper margin to maintain p-channel transistor MPcas1 and n-channel transistor MNcas1 in proper operation, that is, keeping those devices in their respective saturation regions, and thereby preventing those devices from operating in their respective linear regions—in this manner, the difference (vd) between the source nodes of the p-channel transistor pair MPcas1 and MPcas2, and between the source nodes of the n-channel transistor pair MNcas1 and MNcas2, is kept relatively low, so as to also contribute to reducing frequency error.

Note also with respect to the preferred embodiment that the temperature coefficient (TC) of the output frequency $f_{CLKO}$, besides being dependent on the variations in R and C, is also affected by the TC of the amplifier's input referred offset. Silicon results show that, when chopping is disabled, the output clock $f_{CLKO}$ has +/−100 ppm/° C. variation in off-chip R (~Zero TC) mode. This varies from device to device due to temperature drift of random offset of the amplifier. The preferred embodiment implementation of chopping, therefore, reduces or eliminates the effect of offset drift.

While chopping provides the benefits stated above, note also that non-idealities in chopping may cause degradation. Specifically, in the preferred embodiment, $f_{CLKO}$ may be as high as 53 MHz, and as noted above chopping is used for various transistor pairs, which thereby modulates static mismatch errors to chopping frequency. The effectiveness of chopping, however, is limited by the parasitic capacitances Cpar at the drain of the chopped devices, and recall the chopper switches connect the drain nodes alternatively to two source terminals of the cascode transistors (or, in the case on the input n-channel transistor pair MN1 and MN2, the gates are also chopped to restore the negative feedback loop of the overall loop because the drain terminals are also chopped). Any systematic voltage difference (vd) between the source nodes of a cascode pair will get converted by the parasitic cap as a dc error current. This gets divided by the gain ($g_{min}$) of the input pair and appears as input referred residual offset ($V_{os}$) given by the following Equation 3:

$$V_{os} = C_{par} * vd * (f_{CLKO}/2)/g_{min} \qquad \text{Equation 3}$$

where in Equation 3, Cpar is the sum of all the parasitic capacitance associated with that cascode node where the chopper switches are in operation.

$V_{os}/V_{DDLDO}$ changes α in Equation 2, thereby changing the output frequency. To minimize temperature drift in frequency, variation of vd with temperature needs to be minimized. This requires 1) high gain from the cascode to minimize the variation of vd as Vctrl changes with temperature 2) the gate of MPLoad1 in FIG. 3A to be level shifted down to provide required bias margin for MPcas1 especially in corners where the threshold voltage of MPLoad1 is low and 3) the cascode devices to be sized such that the contribution of threshold voltage mismatch of them to vd and its drift with temperature is negligible. The preferred embodiment implements steps in layout to minimize the Cpar and improve symmetry.

$V_{os}$ can also be minimized by increasing gain $g_{min}$. The maximum value of $g_{min}$, however, is limited by the amount of voltage ripple at Vctrl. Ripple leads to frequency modulation, resulting in duty cycle degradation of $f_{CLKO}$ (including after divide by two). The input pair MN1/MN2 is degenerated by resistor Rd to limit the amount of ripple current and Rz is kept to a lowest possible value without affecting stability. The duty cycle degradation of <+/−2% is achieved by proper choice of resistors Rd and Rz.

The preferred embodiment operation of operational amplifier 132 as shown in FIG. 3A also benefits from the cross-coupled capacitors cMN12 and cMN21. Specifically, it is observed in connection the preferred embodiments that the feedback loop of oscillator 100 can undergo large signal transients during any of three different events: (i) startup; (ii) a step change in Tune code of the capacitor array to achieve a different desired frequency $f_{CLKO}$; and (iii) a change from on-chip resistor mode to off-chip resistor mode, leading to charge sharing with the external pad. Any of these events can impose a large differential voltage on the input pair of n-channel transistors MN1 and MN2, which in operation provide slew current to bring $f_{CLKO}$ to a desired value. Recall that the chopper connections in FIG. 3A, when enabled, exchange one of the input pair transistor (OFF device) with the other input pair transistor (ON device) at the rate of $f_{CLKO}$. This leads to charge injections that counteract the slew current, leading to another undesirable operating point where the loop can get stuck or can take an undesirably long time to settle. The cross coupled capacitors cMN12 and cMN21, which recall have capacitance of the order of gate capacitances of the respective n-channel transistors MN1 and MN2, counters/compensates the charge injection currents from those transistors.

Figure 4A:
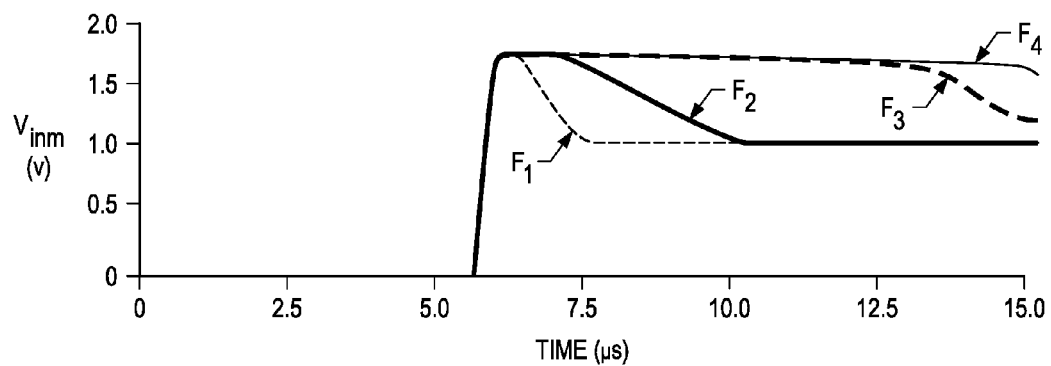
FIG. 4a illustrates operation and response of the FIG. 3A operational amplifier without its input stage cross coupled capacitors.
Figure 4B:
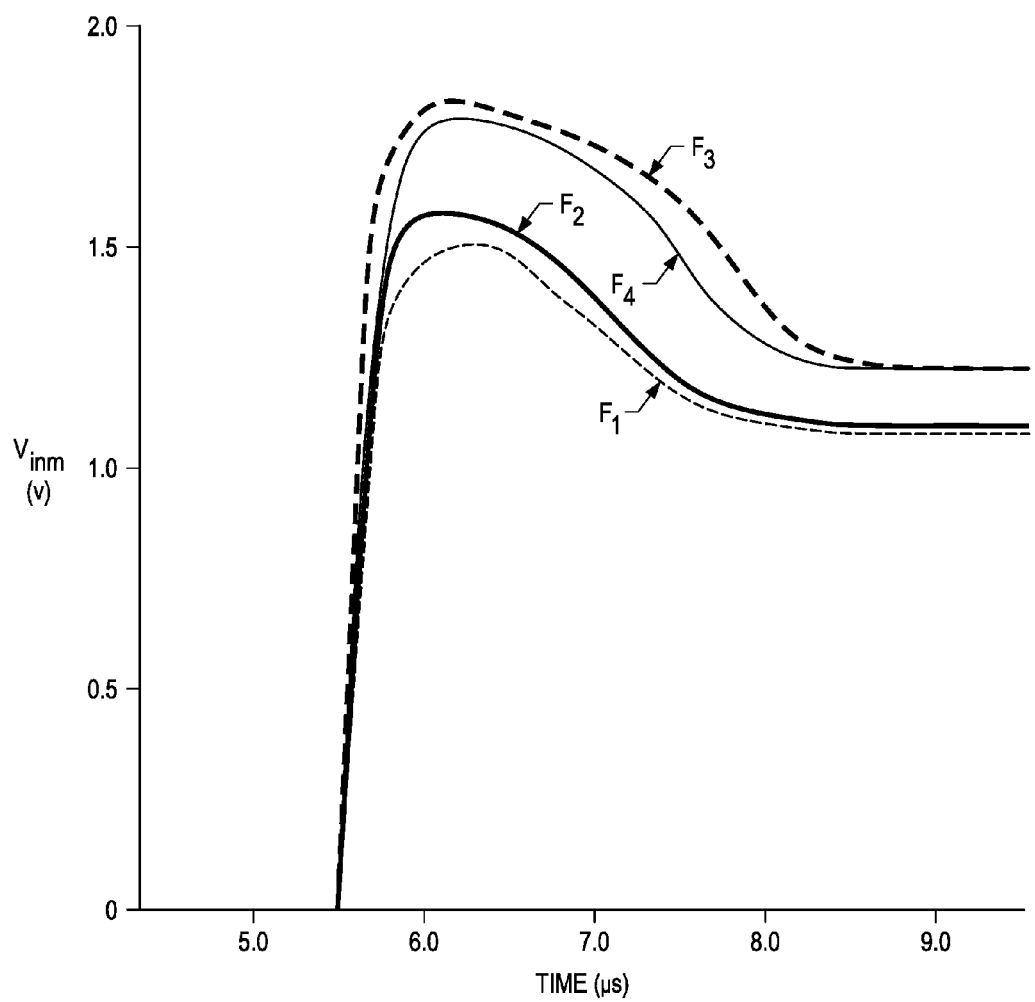
FIG. 4b illustrates operation and response of the FIG. 3A operational amplifier with its input stage cross coupled capacitors.

Further to the above, FIGS. 4a and 4b illustrate, respectively, the behavior of the feedback loop recovery of oscillator 100, without and with cross coupled capacitors cMN12 and cMN21. FIG. 4a illustrates the corresponding behavior of $V_{inm}$ for four different examples of frequencies, shown as $F_1$ through $F_4$, where a large signal disturbance is triggered just after 5.0 μs and released to test loop recovery, and again where cross coupled capacitors cMN12 and cMN21 are not included. Note that $F_1$ and $F_2$ settle after a period of time, whereas $F_3$ takes considerably longer to settle and $F_4$, even by 15.0 μs, has not settled. Thus, FIG. 4a demonstrates that, at some frequencies, the loop behavior, as readily visible in the plot with respect to $V_{inm}$, can have a long recovery time (e.g., >4 µs), where in the illustrated example of frequency $F_3$ the recovery does not being until approximately 12.5 µs (i.e., 7.5 µs following the signal disturbance at 5 µs). Indeed, for another illustrated frequency $F_4$, FIG. 4a illustrates that the loop remains stuck to the edge of the Figure, indicating clearly an undesirable result. In contrast, in FIG. 4b, the inclusion of cross coupled capacitors cMN12 and cMN21 produces faster transitions (e.g., ≤3 µs) and consistency in the loop recovery, again as demonstrated in $V_{inm}$. Also note in connection with FIG. 4b that the plots for $V_{inm}$ corresponding to frequencies $F_1$ and $F_2$ settle to a different value as compared to the plots for frequencies $F_3$ and $F_4$. This is because also included in the plots are the use of different values for the voltage $V_{ref}$ ($V_{DDLDO}$) for the first two frequencies as compared to the second two, as changing this voltage may be desirable in some instances, but also involves tradeoffs. Specifically, at higher $V_{ref}$ and hence a greater difference between $V_{inm}$ and $V_{ref}$, there is a larger charge injection error and the transient swings at $V_{inm}$ will tend to be larger, resulting in less consistent and desirable oscillator loop recovery. Further, loop recovery is likely to be most diminished at the corner where the tail current of the input differential pair of nMOS transistors MN1 and MN2 is relatively low, as the charge injection currents oppose the slew current so a reduced slew current becomes such a corner. To address this, a preferred embodiment may increase slew currents, but this comes at a tradeoff in requiring higher power consumption and also may require an increase in size of the input differential pair of nMOS transistors MN1 and MN2, thereby increasing the chopping-related injection current so that the increase in currents may not be sufficiently effective. Hence, these considerations may be addressed by adjusting $V_{ref}$, as again is shown in frequencies $F_1$ and $F_2$ versus frequencies $F_3$ and $F_4$.

From the above, various embodiments provide numerous improvements to integrated circuit oscillators. Such benefits include the use of chopping in a high frequency oscillator, thereby enabling lower chip area and reducing cost, and further including cross-coupled amplifier input stage capacitors to inject charges to counteract the undesirable charge injections that may be provided by the chopped input pair, thereby improving loop recovery. The low area chopper based implementation therefore makes feasible very high output frequencies, such as 50 MHz or above. Moreover, with the reduced possibility of the loop becoming stuck or undesirably delaying recovery, startup may occur rapidly by pre-charging the oscillator with less possibility of undesirable sticking or lockup. As yet another benefit, various embodiments permit additional trimming of the oscillator output frequency via a capacitor array and either on on-chip or off-chip resistance. Still further, frequency accuracy in response to changes in temperature is improved over the prior art. In implementing the present teachings, a 9-bit linear RC oscillator supporting a wide frequency range of 11-53 MHz may be implemented, with DNL of <+/−0.8 LSB achieved at 9 bit level of frequency tuning. Frequency stability is +/−25-ppm/deg C. for the temperature range between −40 to 85 deg C. in off-chip resistor mode. Further, the oscillator may be implemented in a 90 nm CMOS process technology, occupying 0.1 $mm_2$ area and consuming 5 µA/MHz. Yet still further, while one preferred embodiment implements oscillator 100 into a microcontroller, related preferred embodiment devices such as microprocessors, digital signal processors, and other devices that incorporate the inventive oscillator may be readily developed or ascertained by one skilled in the art. Various aspects have been described, and still others will be ascertainable by one skilled in the art from the present teachings. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. Circuitry for providing an oscillating output signal, comprising:
    a transconductance circuit having a first input, a second input, an output, and comprising:
        a first transistor, wherein the first transistor comprises a first transistor in an input stage of the transconductance circuit;
        a second transistor, wherein the second transistor comprises a second transistor in the input stage of the transconductance circuit;
        a first capacitor connected from a gate of the first transistor to a drain of the second transistor; and
        a second capacitor connected from a gate of the second transistor to a drain of the first transistor; and
        chopping circuitry for alternatively connecting, in a first clock cycle phase, a first node to a first terminal of the first transistor and a second node to a first terminal of the second transistor and, in a second clock cycle phase following the first clock cycle phase, the first node to the first terminal of the second transistor and the second node to the first terminal of the first transistor;
    an oscillator circuit coupled to receive voltage from the output of the transconductance circuit, wherein the oscillating output signal is responsive to an output of the oscillator circuit;
    circuitry for providing a first voltage to the first input of the transconductance circuit; and
    a frequency controlled circuit for providing a second voltage to the second input of the transconductance circuit.

2. The circuitry of claim 1 wherein the frequency of operation of the frequency controlled circuit is responsive to feedback derived from the output of the oscillator circuit.

3. The circuitry of claim 1 wherein the frequency controlled circuit comprises:
    a plurality of capacitors; and
    selection circuitry for selecting selected capacitors among the plurality of capacitors to tune a total capacitance provided by the frequency controlled circuit.

4. The circuitry of claim 3 wherein the oscillating output signal has a frequency in response to the total capacitance.

5. The circuitry of claim 3 and further comprising a resistance circuit coupled to the second input of the transconductance circuit.

6. The circuitry of claim 5 wherein the resistance circuit comprises an integrated resistance.

7. The circuitry of claim 5 wherein the resistance circuit comprises an off-chip resistance.

8. The circuitry of claim 5 wherein the resistance circuit comprises a selectable resistance from an integrated resistance and an off-chip resistance.

9. The circuitry of claim 3 and further comprising two-phase circuitry for coupling the plurality of capacitors to a voltage supply during a first phase and coupling the selected capacitors to the first input of the transconductance circuit during a second phase.

10. The circuitry of claim 1 wherein the oscillating output signal is operable up to at least 50 MHz.

11. The circuitry of claim 1 wherein the chopping circuitry is for alternatively connecting, in a first clock cycle phase, a first node to a gate of the first transistor and a second node to a gate of the second transistor and, in a second clock cycle phase following the first clock cycle phase, the first node to the gate of the second transistor and the second node to the gate of the first transistor.

12. The circuitry of claim 11 wherein the chopping circuitry is further for alternatively connecting, in the first clock cycle phase, a drain of the first transistor to a first conductive path and a drain of the second transistor to a second conductive path and, in a second clock cycle phase following the first clock cycle phase, the drain of the first transistor to the second conductive path and the drain of the second transistor to the first conductive path.

13. The circuitry of claim 1:
wherein the first capacitor has a capacitance equal to or greater than a gate-to-source capacitance of the first transistor; and
wherein the second capacitor has a capacitance equal to or greater than a gate-to-source capacitance of the second transistor.

14. The circuitry of claim 1 wherein the transconductance circuit further comprises:
a first current path, responsive to a first amount of current conducted by the first transistor, and comprising a first plurality of transistors and a first node for providing the output; and
a second current path, responsive to a second amount of current conducted by the second transistor, and comprising a second plurality of transistors and a second node; and
circuitry coupled to the second node for maintaining the second plurality of transistors in a saturation region of operation.

15. The circuitry of claim 14:
wherein the first current path comprises a first p-channel transistor and a first n-channel transistor and the first node comprises a drain of the first p-channel transistor and a drain of the first n-channel transistor; and
wherein the second current path comprises a second p-channel transistor and a second n-channel transistor and the second node comprises a drain of the second p-channel transistor and a drain of the second n-channel transistor.

16. The circuitry of claim 15 and further comprising:
chopping circuitry for alternatively connecting, in the first clock cycle phase, a source of the first p-channel transistor to a second terminal of the first transistor and a source of the second p-channel transistor to a second terminal of the second transistor and, in the second clock cycle phase,
the source of the first p-channel transistor to a second terminal of the second transistor the a source of the second p-channel transistor to a second terminal of the first transistor.

17. The circuitry of claim 1 wherein the first node comprises the first input and wherein the second node comprises the second input.

18. Circuitry for providing an oscillating output signal, comprising:
a transconductance circuit having a first input, a second input, an output, and comprising:
a first transistor;
a second transistor;
chopping circuitry for alternatively connecting, in a first clock cycle phase, a first node to a first terminal of the first transistor and a second node to a first terminal of the second transistor and, in a second clock cycle phase following the first clock cycle phase, the first node to the first terminal of the second transistor and the second node to the first terminal of the first transistor;
a first current path, responsive to a first amount of current conducted by the first transistor, and comprising a first plurality of transistors and a first node for providing the output; and
a second current path, responsive to a second amount of current conducted by the second transistor, and comprising a second plurality of transistors and a second node; and
circuitry coupled to the second node for maintaining the second plurality of transistors in a saturation region of operation;
an oscillator circuit coupled to receive voltage from the output of the transconductance circuit, wherein the oscillating output signal is responsive to an output of the oscillator circuit;
circuitry for providing a first voltage to the first input of the transconductance circuit; and
a frequency controlled circuit for providing a second voltage to the second input of the transconductance circuit.

19. A method of operating circuitry for providing an oscillating output signal, the circuitry comprising a transconductance circuit having a first input, a second input, an output, and comprising:
a first transistor, wherein the first transistor comprises a first transistor in an input stage of the transconductance circuit;
a second transistor, wherein the second transistor comprises a second transistor in the input stage of the transconductance circuit;
a first capacitor connected from a gate of the first transistor to a drain of the second transistor; and
a second capacitor connected from a gate of the second transistor to a drain of the first transistor; and
the method comprising:
alternatively connecting, in a first clock cycle phase, a first node to a first terminal of the first transistor and a second node to a first terminal of the second transistor and, in a second clock cycle phase following the first clock cycle phase, the first node to the first terminal of the second transistor and the second node to the first terminal of the first transistor;
receiving a voltage from the output of the transconductance circuit by an oscillator circuit, wherein the oscillating output signal is responsive to an output of the oscillator circuit;
providing a first voltage to the first input of the transconductance circuit; and
providing a second voltage to the second input of the transconductance circuit from a frequency controlled circuit.

* * * * *